United States Patent
Mizuno et al.

(10) Patent No.: US 8,519,383 B2
(45) Date of Patent: Aug. 27, 2013

(54) ORGANIC ELECTROLUMINESCENCE DISPLAY APPARATUS WITH REDUCED CHROMATICITY DIFFERENCE CAUSED BY LIGHT EMISSION FROM AN ORGANIC LAYER INCLUDING AN EMISSION LAYER HAVING THE SAME COLOR WHICH IS CONTINUOUSLY FORMED OVER TWO SUB-PIXELS

(75) Inventors: Nobutaka Mizuno, Mobara (JP); Nobuhiko Sato, Mobara (JP); Kohei Nagayama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 224 days.

(21) Appl. No.: 12/993,302

(22) PCT Filed: Jul. 10, 2009

(86) PCT No.: PCT/JP2009/062929
§ 371 (c)(1),
(2), (4) Date: Nov. 18, 2010

(87) PCT Pub. No.: WO2010/005115
PCT Pub. Date: Jan. 14, 2010

(65) Prior Publication Data
US 2011/0095279 A1    Apr. 28, 2011

(30) Foreign Application Priority Data

Jul. 11, 2008   (JP) .............................. 2008-181507
Jul. 9, 2009    (JP) .............................. 2009-162847

(51) Int. Cl.
*H01L 51/52*    (2006.01)
(52) U.S. Cl.
USPC ...... 257/40; 257/E51.021; 313/503; 313/504; 313/505
(58) Field of Classification Search
USPC ................ 313/503–506; 257/40, E51.021
See application file for complete search history.

(56) References Cited

U.S. PATENT DOCUMENTS 5,707,745 A    1/1998    Forrest et al. ................. 428/432
7,538,487 B2   5/2009    Hasegawa et al. ............ 313/504
(Continued)

FOREIGN PATENT DOCUMENTS

JP    10-012380    1/1998
JP    2002-260859  9/2002
(Continued)

OTHER PUBLICATIONS

D.G. Deppe et al., "Spontaneous emission from planar microstructures," Journal of Modern Optics, vol. 41, No. 2, pp. 325-344 (1994).

(Continued)

*Primary Examiner* — Fernando L Toldeo
*Assistant Examiner* — Peter Bradford
(74) *Attorney, Agent, or Firm* — Fitzpatrick, Cella, Harper & Scinto

(57) ABSTRACT

Provided is an organic electroluminescence display apparatus capable of reducing a chromaticity difference caused by light emission from an organic layer including an emission layer having the same color, which is continuously formed over two sub-pixels included in a pixel. The organic electroluminescence display apparatus includes: a substrate; and multiple organic electroluminescence devices which are stacked on the substrate, each of which includes electrodes and an organic layer sandwiched by the electrodes in which first organic layer and a second organic layer are arranged side by side in an emission region corresponding to a pixel formed on the substrate and a third organic layer is stacked over the first organic layer and the second organic layer through an intermediate electrode. The third organic layer has an emission spectrum peak wavelength which is longer than an emission spectrum peak wavelength of at least one of the first organic layer and the second organic layer.

15 Claims, 3 Drawing Sheets

(56) References Cited

U.S. PATENT DOCUMENTS

| | | | |
|---|---|---|---|
| 7,843,123 B2 | 11/2010 | Mizuno et al. | 313/501 |
| 8,253,127 B2 * | 8/2012 | Kang et al. | 257/40 |
| RE43,759 E * | 10/2012 | Shimoda et al. | 313/506 |
| 2003/0044639 A1 | 3/2003 | Fukuda | 428/690 |
| 2005/0073248 A1 | 4/2005 | Haerle et al. | 313/504 |
| 2005/0206305 A1 | 9/2005 | Masuda et al. | 313/504 |
| 2005/0280008 A1 * | 12/2005 | Ricks et al. | 257/79 |
| 2006/0138418 A1 | 6/2006 | Lee et al. | 257/59 |
| 2006/0232202 A1 * | 10/2006 | Matsuda et al. | 313/506 |
| 2007/0057264 A1 * | 3/2007 | Matsuda | 257/88 |
| 2008/0136322 A1 * | 6/2008 | Kurotaki et al. | 313/504 |
| 2008/0164809 A1 * | 7/2008 | Matsunami et al. | 313/504 |
| 2009/0134787 A1 * | 5/2009 | Matsuo | 313/504 |
| 2009/0189834 A1 * | 7/2009 | Ohshima et al. | 345/77 |

FOREIGN PATENT DOCUMENTS

| | | |
|---|---|---|
| JP | 2003-036973 | 2/2003 |
| JP | 2003-142277 | 5/2003 |
| JP | 2005-174639 | 6/2005 |

OTHER PUBLICATIONS

International Preliminary Report on Patentability issued in corresponding International Application No. PCT/JP2009/062929—6 pages.

Chinese Office Action issued in corresponding application 200980126363.7 on Aug. 2, 2012—8 pages with English translation.

* cited by examiner

ORGANIC ELECTROLUMINESCENCE DISPLAY APPARATUS WITH REDUCED CHROMATICITY DIFFERENCE CAUSED BY LIGHT EMISSION FROM AN ORGANIC LAYER INCLUDING AN EMISSION LAYER HAVING THE SAME COLOR WHICH IS CONTINUOUSLY FORMED OVER TWO SUB-PIXELS

TECHNICAL FIELD

The present invention relates to an organic EL display apparatus, and more particularly, to an emission spectrum in a case where organic electroluminescence (EL) devices are stacked.

BACKGROUND ART

In order to lengthen the life of devices in an organic EL display apparatus, structures in which organic EL devices are stacked have been proposed. Each of the organic EL devices generally has an organic layer including an emission layer and electrodes sandwiching the organic layer.

According to Japanese Patent Application Laid-Open No. 2005-174639, each pixel includes two sub-pixels. Each of the sub-pixels has a structure in which two organic EL layers having different luminescent colors are stacked to sandwich an electrode. The organic EL layer of an upper layer is provided with an emission layer which emits blue light, which is provided in every sub-pixel.

In generally, an organic EL device has a thickness equal to a wavelength of light and thus is greatly influenced by optical interference effects. When the emission layers of the respective organic EL layers emit lights, the lights are extracted to an outside after repetition of reflection, refraction, transmission, and absorption which are caused by differences between refractive indexes and absorption coefficients of the respective constituent layers. An amount of extracted lights is increased by constructive interference of lights passing through various paths.

The effect in view of interference effect of light is considered with regard to the configuration shown in FIG. 1.

FIG. 1 is a schematic view illustrating a case where a third organic EL layer 16 which emits blue light is stacked over a first organic EL layer 13 which emits green light, and a fourth organic EL layer 17 which emits blue light is stacked over a second organic EL layer 14 which emits red light. The third organic EL layer 16 and the fourth organic EL layer 17 are arranged side by side. Further, FIG. 1 shows a substrate 1, a first electrode (reflective electrode) 2a and 2b, a second electrode 5, and a third electrode 7. In view of an influence of interference, an interference effect between a direct light traveling from a light emitting position to a light extraction direction and light which is reflected on a reflective electrode and travels in the light extraction direction is maximum.

In this case, when the following relational expression (1) is satisfied, improvement of extraction efficiency due to interference is expected.

$$2L/\lambda + \delta/2\pi = m \quad (1)$$

where L indicates an optical distance between an emission region of an emission layer and a reflection surface of the reflective electrode, $\lambda$ indicates an emission spectrum peak wavelength of the emission layer, $\delta$ indicates a phase shift amount on the reflective electrode, and m indicates a natural number.

The expression (1) is derived from a constructive interference condition of an organic EL emission spectrum in a case of a resonance structure in D. G. Deppe, et al., Journal of Modern Optics, Volume 41, No. 2, p. 325-344 (1994).

The interference conditional expression (1) is used to obtain suitable optical path lengths in the light emission of the first organic EL layer 13 and the second organic EL layer 14 in a case of m=2. Results are illustrated in Table 1.

In Table 1, $\lambda 1$ indicates an wavelength to be enhanced in the light emission of the first organic EL layer 13, and L1 indicates an optical distance between an emission region of the first organic EL layer 13 and the reflection surface of the reflective electrode 2a.

In addition, $\lambda 2$ indicates a wavelength to be enhanced in the light emission of the second organic EL layer 14, and L2 indicates an optical distance between an emission region of the second organic EL layer 14 and the reflection surface of the reflective electrode 2b.

Further, $\lambda 3$ indicates a wavelength to be enhanced in the light emission of the third organic EL layer 16. L3 indicates an optical distance between an emission region of the third organic EL layer 16 and the reflection surface of the reflective electrode 2a. L4 indicates an optical distance between an emission region of the fourth organic EL layer 17 and the reflection surface of the reflective electrode 2b.

A phase shift on a reflection metal film is substantially $\pi$, and hence the calculation is performed on the assumption that $\delta$ is equal to $\pi$. It is suitable to make the wavelength to be enhanced equal to a photoluminescence (PL) peak wavelength because light emitting efficiency is improved. The PL is an emission spectrum generated in a case of photoexcitation.

The wavelength to be enhanced $\lambda 1$ is set to 530 nm which is a PL peak wavelength of a green emission from the first organic EL layer 13. The wavelength to be enhanced $\lambda 2$ is set to 630 nm which is a PL peak wavelength of a red emission from the second organic EL layer 14. The wavelength to be enhanced $\pi 3$ is set to 450 nm which is a PL peak wavelength of a blue emission from the third organic EL layer 16 and the fourth organic EL layer 17.

As is apparent from Table 1, when the PL peak wavelength which is the emission wavelength to be enhanced changes, the suitable optical path length changes.

Further, Table 1 shows optimum interference distance at respective wavelengths derived from relational expression (1). In accordance with Table 1, setting optical distances of L1 to L4 in FIG. 1 are considered. L1 and L2 are 398 nm and 473 nm, respectively, since L1 and L2 are adjusted to the optimum interference distance corresponding to $\lambda 1$ and $\lambda 2$ shown in Table 1.

TABLE 1

| Wavelength (nm) | | Order | | Optimum Interference Distance (nm) | |
|---|---|---|---|---|---|
| $\lambda 1$ | 530 | m | 2 | L | 398 |
| $\lambda 2$ | 630 | m | 2 | L | 473 |
| $\lambda 3$ | 450 | m | 3 | L | 563 |

Here, interference effect in the case where the third organic EL layer 16 and the fourth organic El layer 17 are formed in the same thickness is considered.

As is apparent from FIG. 1, the third organic EL layer 16 is stacked over the first organic EL layer 13 and the fourth organic EL layer 17 is stacked over the second organic EL layer 14. The third organic EL layer 16 and the fourth organic EL layer 17 are included in the two sub-pixels. Therefore, with respect to the optical distance between the emission region of the third organic EL layer 16 and the reflection surface of the reflective electrode, an optical distance L3 at a stacked position of the first organic EL layer 13 is different from an optical distance L4, which is between the emission region of the fourth organic EL layer 17 and the reflection surface of the reflective electrode, at a stacked position of the second organic EL layer 14.

For example, when L3 is set to 563 nm which is optimum interference distance, L4 is longer by 75 nm which is difference between L1 and L2.

As described above, the optical interference condition is changed by the difference between the optical distances. Thus, there arises a problem that the chromaticity of the light emitted from the third organic EL layer 16 is different from the chromaticity of the light emitted from the third organic EL layer 17.

On the other hand, in order that optical interference conditions are made equal and chromaticity is made equal in the third organic EL layer 16 and the fourth organic EL layer 17, it is necessary that thicknesses of the third organic EL layer 16 and the fourth organic EL layer 17 are changed and positions of emission region are made changed. In this case, the problem in that the film formation step comes to be complicated occurs.

DISCLOSURE OF THE INVENTION

Therefore, it is an object of the present invention to simplify an organic EL display apparatus and to reduce a chromaticity difference caused by light emission from an organic EL layer including an emission layer having the same color, which is continuously formed over two sub-pixels included in a pixel.

In order to solve the problem as described above, the followings are provided.

There is provided an organic EL display apparatus, including:
a substrate; and
multiple organic electroluminescence devices which are stacked on the substrate, each of which includes electrodes and an organic layer which includes at least an emission layer and which is sandwiched by the electrodes,
wherein the organic layers include:
a first organic layer contained in a first organic electroluminescence device and a second organic layer contained in a second organic electroluminescence device, the first organic layer and the second organic layer being arranged side by side in an emission region corresponding to a pixel, wherein a distance between the electrodes sandwiching the first organic layer and a distance sandwiching the second organic layer are different; and
a third organic layer having a same thickness continuously stacked over the first organic layer and the second organic layer through an intermediate electrode, and
wherein the third organic layer has an emission spectrum peak wavelength which is longer than an emission spectrum peak wavelength of at least one of the first organic layer and the second organic layer.

According to the present invention, the organic EL display apparatus is capable of simplifying and displaying a high-quality image obtained by reducing the chromaticity difference caused by light emission from the organic EL layer including the organic emission layer, which is continuously formed over the two sub-pixels.

Further features of the present invention will become apparent from the following description of exemplary embodiments with reference to the attached drawings.

BEST MODE FOR CARRYING OUT THE INVENTION

Hereinafter, display apparatuses according to embodiments of the present invention are described with reference to the attached drawings.

In the specification, technologies well known or publicly known in the technology field are applied to portions which are not particularly illustrated or described. The following embodiments are merely examples of the present invention. Therefore, the present invention is not limited to the embodiments.

Embodiment 1

Figure 1:
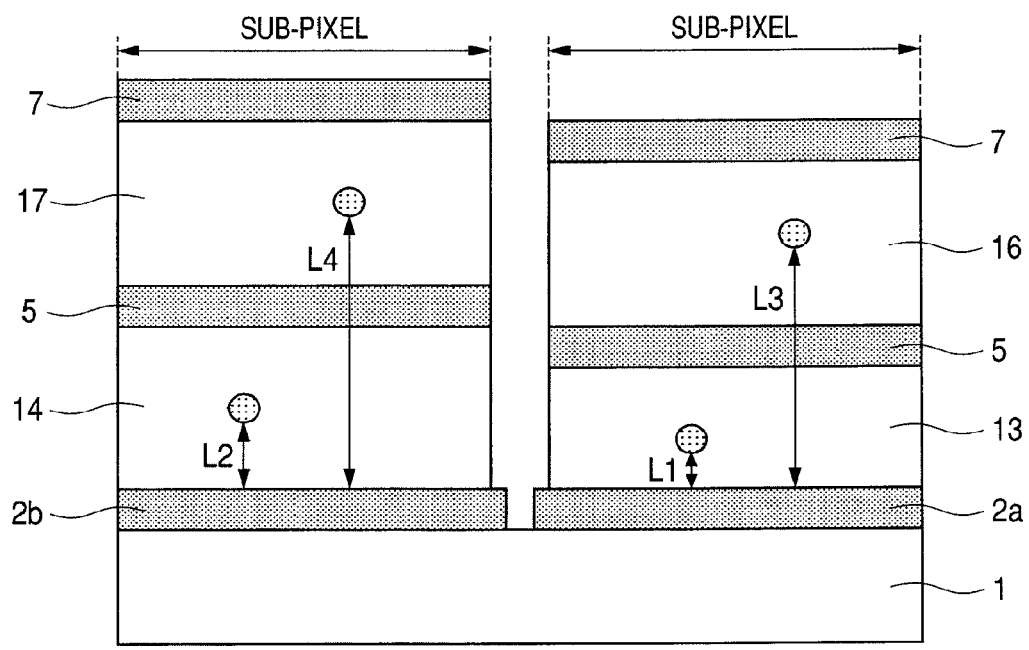
FIG. 1 is a schematic cross sectional view illustrating a conventional organic EL display apparatus.
Figure 2:
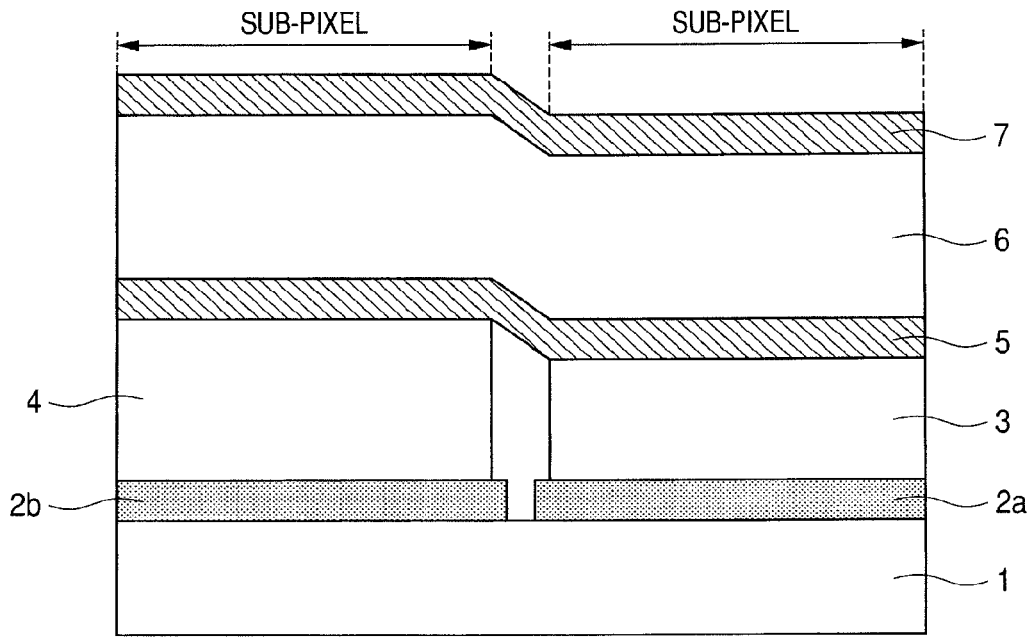
FIG. 2 is a schematic cross sectional view illustrating the organic EL display apparatus according to Embodiment 1 of the present invention.

As illustrated in FIG. 2, an organic EL display apparatus according to this embodiment includes two sub-pixels for each pixel. In each of the sub-pixels, two organic EL layers having different luminescent colors are stacked to sandwich an electrode.

The organic EL layers sandwiching the electrode correspond to organic EL devices, and multiple organic EL devices are arranged on the organic EL display apparatus.

In view of the convenience of a process, the third organic EL layer is continuously formed over the two sub-pixels.

The organic EL layer (organic layer) includes an emission layer and is made of an organic material. Any one of a single-layer type (emission layer) and a two-layer type (emission layer and hole injection layer) may be used. Any one of a three-layer type (electron transport layer, emission layer, and hole transport layer), a four-layer type (electron injection layer, emission layer, hole transport layer, and hole injection layer), and a five-layer type (electron injection layer, electron transport layer, emission layer, hole transport layer, and hole injection layer), may be used.

The organic EL display apparatus has a structure in which first electrodes 2a and 2b each having reflectivity and serving as a reflective electrode, a first organic EL layer (first organic layer) 3, a second organic EL layer (second organic layer) 4, a second electrode 5 (an intermediate electrode), a third organic EL layer (third organic layer) 6, and a third electrode 7 are provided on a substrate 1 in the stated order. At least parts of the third organic EL layer are stacked over the first organic EL layer 3 and the second organic EL layer 4.

The first electrodes 2a and 2b are formed on an insulating substrate 1 and serve as anodes.

An electrode material of the first electrodes 2a and 2b is desirably a light reflective material, for example, Cr, Al, Ag, Au, or Pt. When a material whose reflectance is high is used, light extraction efficiency may be improved.

The first electrodes 2a and 2b may have a structure in which the reflective function is provided by the light reflective material and the electrode function is provided by a transparent conductive film such as an ITO film which is formed on the light reflective material. For example, there may be provided a structure in which an ITO electrode is stacked on an Ag reflection film.

In the first sub-pixel (region located on right side of FIG. 2), the third organic EL layer 3 having a blue luminescent color and the third organic EL layer 6 having a red luminescent color are stacked to sandwich the second electrode 5.

In the second sub-pixel (region located on left side of FIG. 2), the second organic EL layer 4 having a green luminescent color and the third organic EL layer 6 are stacked to sandwich the second electrode 5.

A material used for the second electrode 5 is, for example, a transparent conductive film made of ITO or IZO, a metal conductive film made of Al, Ag, or Mg, or a stacked layer thereof.

When a metal conductive thin film whose thickness is approximately 10 nm to 20 nm is used as the second electrode 5, the second electrode 5 is a translucent film. Therefore, resonance effects of the first organic EL layer 3 and the second organic EL layer 4 which are sandwiched by the first electrodes 2a and 2b and the second electrode 5 are desirably improved. Further, when the first organic EL layer 3 and the second organic EL layer 4 are configured so as to satisfy the expression (1), resonance effects are desirably improved.

The third organic EL layer 6 is formed on the second electrode 5 in the both sub-pixels so as to be stacked over the first organic EL layer 3 and the second organic EL layer 4.

The third electrode 7 is formed as a cathode on the third organic EL layer 6.

A conventional publicly-known method may be used as a method for forming the electrodes and the organic EL layers. For example, a vapor deposition method or a transfer method may be used to form the organic EL layers. A vapor deposition method or a sputtering method may be used to form the electrodes.

When the organic EL display apparatus manufactured as described above is driven, the problem occurs that emission chromaticity of the third organic EL layer 6 is changed between the sub-pixels.

In particular, when the third organic EL layer formed in common to the two sub-pixels is formed closer to a light extraction side with respect to the first organic EL layer and the second organic EL layer, a chromaticity difference between the sub-pixels is large.

This is because, as shown in FIG. 2, an optical distance between the third organic EL layer 6 and the side of the first electrode 2a having reflectivity is different from an optical distance between the third organic EL layer 6 and the side of the first electrode 2b having reflectivity In order to solve the problem that the emission chromaticity is changed according to the change in optical distance, according to this embodiment, a PL peak wavelength of light from the third organic EL layer 6 is set to a value larger than a PL peak wavelength of light from at least one of the first organic EL layer 3 and the second organic EL layer 4.

The reason why the structure as described above is employed is as follows.

The optical distances in the first sub-pixel and the second sub-pixel are different from each other, and hence interference effects in the respective sub-pixels are different from each other. Assume that, when the luminescent color of the third organic EL layer 6 is blue and when the luminescent color thereof is red, each of spectrums of luminescent colors which are emitted from the organic EL display apparatus and have the respective luminescent colors is shifted to a long-wavelength side by 10 nm.

In such a case, with respect to changes in peak wavelengths of the spectrums of the respective luminescent colors, the peak wavelength of the emission spectrum of blue is changed from 450 nm to 460 nm and the peak wavelength of the emission spectrum of red is changed from 620 nm to 630 nm. This exhibits that a change rate of the peak wavelength of the emission spectrum of red is relatively smaller than a change rate of the peak wavelength of the emission spectrum of blue.

Therefore, when the change rate of the peak wavelength of each of the emission spectrums is small, the influence of the change in chromaticity due to the optical distance difference is small.

Thus, as described above, the PL peak wavelength of the light from the third organic EL layer 6 is set to the value larger than the PL peak wavelength of the light from at least one of the first organic EL layer 3 and the second organic EL layer 4.

In general, the PL peak wavelength of blue is approximately 440 nm to 470 nm, the PL peak wavelength of green is approximately 510 nm to 540 nm, and the PL peak wavelength of red is approximately 600 nm to 630 nm. Therefore, when a pixel has three colors of R, G, and B, it is very suitable to employ a structure in which the third organic EL layer 6 formed in common to the two sub-pixels includes an emission layer of red with the longest wavelength, as in this embodiment.

Even in a case of different chromaticities, it is suitable for the third organic EL layer 6 to use an emission layer of green which is easily sensed as the same color by human eyes. In particular, it is desirable to use the emission layer of green because the chromaticity difference is smaller than in a case of an emission layer of blue with the shortest wavelength.

Table 2 illustrates the light emission chromaticities of the organic EL layers of the respective colors in this embodiment.

The third organic EL layer 6 is formed in common to the two sub-pixels and the emission chromaticity is changed between the two sub-pixels for the reason described above.

In this embodiment, from Table 2, the emission chromaticity difference between the sub-pixels in the third organic EL layer 6 is 0.021 which is expressed as a geometrical distance $\Delta xy$ on CIExy.

A geometrical distance on u'v' chromaticity which is set so as to be substantially proportional to a color sense difference actually sensed by a person is 0.038.

TABLE 2

| Third organic EL layer (R) | | | |
|---|---|---|---|
| CIEx | CIEy | CIEx | CIEy |
| 0.699 | 0.331 | 0.684 | 0.316 |
| Second organic EL layer (G) | | First organic EL layer (B) | |
| CIEx | CIEy | CIEx | CIEy |
| 0.274 | 0.646 | 0.132 | 0.099 |
| Chromaticity difference between sub-pixels | | | |
| $\Delta xy$ | | 0.021 | |
| $\Delta u'v'$ | | 0.038 | |

<Each Pixel Circuit in Organic EL Display Apparatus>

Figure 3:
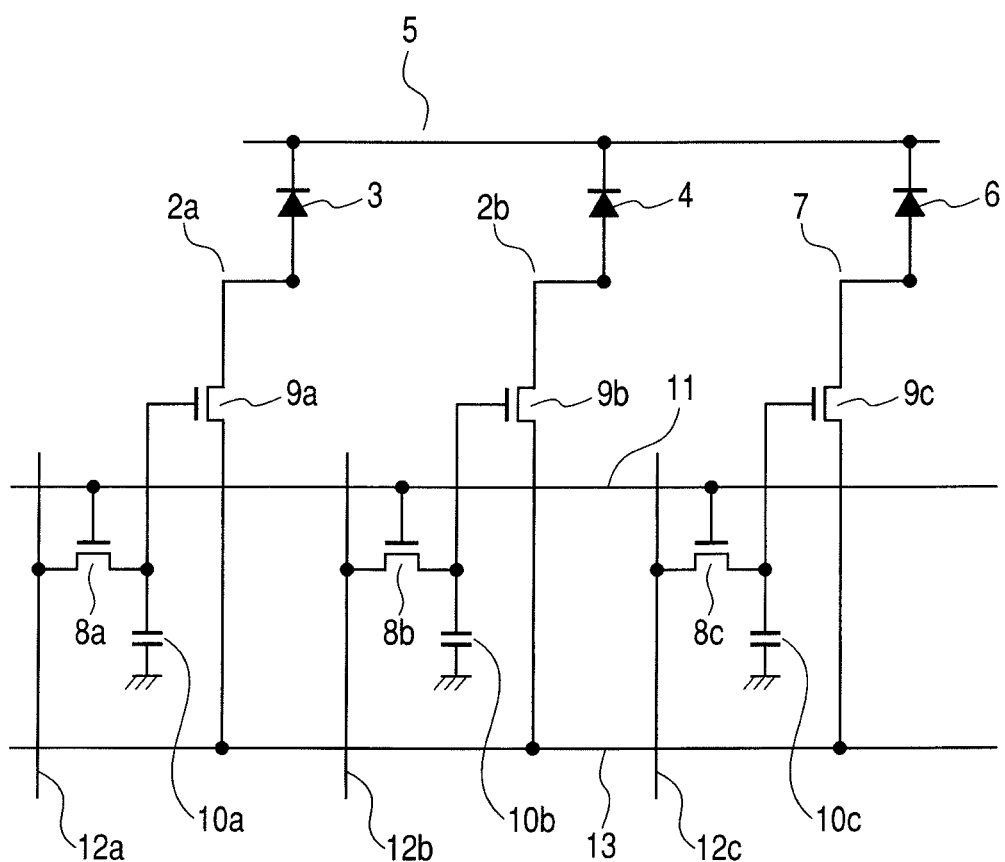
FIG. 3 is a circuit diagram illustrating each pixel circuit in Embodiment 1 of the present invention.

FIG. 3 illustrates each pixel circuit in the organic EL display apparatus manufactured as described above.

The respective sub-pixels include switching thin film transistors (TFTs) 8a, 8b, and 8c, driver TFTs 9a, 9b, and 9c, organic EL devices (light emitting devices) respectively stacked on the driver TFTs 9a, 9b, and 9c, and capacitors 10a, 10b, and 10c.

Gate electrodes of the switching TFTs 8a, 8b, and 8c are connected to a gate signal line 11. Source regions of the switching TFTs 8a, 8b, and 8c are respectively connected to source signal lines 12a, 12b, and 12C, and drain regions thereof are respectively connected to gate electrodes of the driver TFTs 9a, 9b, and 9c.

Source regions of the driver TFTs 9a, 9b, and 9c are connected to a power supply line 13. Drain regions of the driver TFTs 9a, 9b, and 9c are connected to terminal electrodes of the light emitting devices. For example, the drain regions of the driver TFTs 9a, 9b, and 9c are connected to the first electrodes 2a and 2b and the third electrode 7 as illustrated in FIG. 2.

The capacitors 10a, 10b, and 10c are formed so that first electrodes thereof are connected to the gate electrodes of the driver TFTs 9a, 9b, and 9c and second electrodes thereof are connected to a ground terminal (GND).

As described above, the driver TFTs 9a, 9b, and 9c and the organic EL devices are connected in series. Currents flowing into the light emitting devices are controlled by the driver TFTs 9a, 9b, and 9c based on data signals supplied from the source signal lines 12a, 12b, and 12c, to perform light emission control.

Comparative Embodiment 1

Comparative Embodiment 1 shows a case where an organic EL layer including an emission layer of blue (expressed by B in table, which is abbreviation for blue) is formed in common to the two sub-pixels on an organic EL layer including an emission layer of green (expressed by G in table, which is abbreviation for green) and an organic EL layer including an emission layer of red (expressed by R in table, which is abbreviation for red) through an electrode.

In Comparative Embodiment 1, the organic EL layer of red and the organic EL layer of blue in Embodiment 1 are interchanged.

Table 3 illustrates light emission chromaticities of the organic EL layers of the respective colors in Comparative Embodiment 1.

In Comparative Embodiment 1, as in Embodiment 1, the emission chromaticity of the organic EL layer of blue which is formed in common to the two sub-pixels is changed between the sub-pixels. Specifically, the emission chromaticity difference between the sub-pixels is 0.123 as Δxy and 0.282 as Δu'v'.

Therefore, as is apparent from Tables 2 and 3, the structure in which the organic EL layer including the emission layer of red with the longest wavelength is formed in common to the two sub-pixels has the small chromaticity difference between the sub-pixels, as in Embodiment 1.

Thus, according to Embodiment 1, the chromaticity difference between the sub-pixels in the emission layer of the organic EL layer formed in common to the two sub-pixels is small, and hence a high-quality image may be displayed on the organic EL display apparatus manufactured by the simple process.

TABLE 3

| Third organic EL layer (B) | | | |
|---|---|---|---|
| CIEx | CIEy | CIEx | CIEy |
| 0.146 | 0.092 | 0.103 | 0.207 |
| Second organic EL layer (G) | | First organic EL layer (R) | |
| CIEx | CIEy | CIEx | CIEy |
| 0.269 | 0.686 | 0.676 | 0.324 |
| Chromaticity difference between sub-pixels | | | |
| Δxy | | 0.123 | |
| Δu'v' | | 0.282 | |

Embodiment 2

Figure 4:
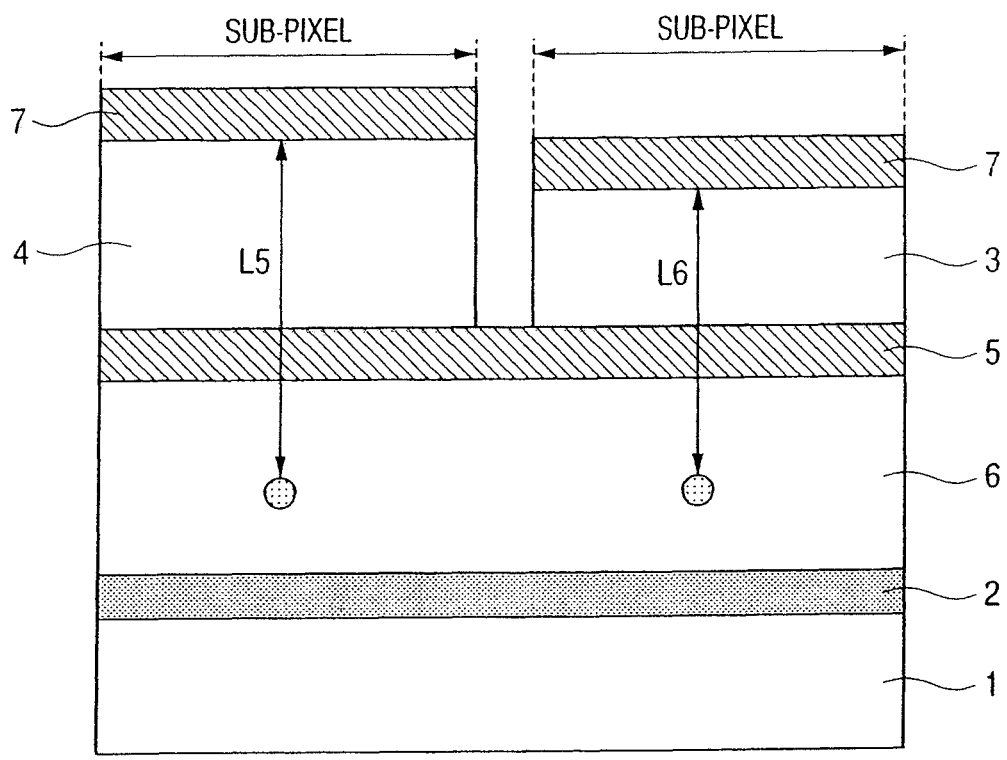
FIG. 4 is a schematic cross sectional view illustrating an organic EL display apparatus according to Embodiment 2 of the present invention.

As illustrated in FIG. 4, an organic EL display apparatus according to this embodiment includes two sub-pixels for each pixel. In each of the sub-pixels, two organic EL layers having different luminescent colors are stacked to sandwich an electrode.

In view of the convenience of a process, a third organic EL layer 6 is formed in common to the two sub-pixels.

The organic EL display apparatus has a structure in which a first electrode 2 having reflectivity, the third organic EL layer 6, a second electrode 5, a first organic EL layer 3, a second organic EL layer 4, and a third electrode 7 are provided on a substrate 1 in the stated order.

A maximum optical interference effect is an interference effect between light which is emitted from each emission region and travels in a light extraction direction (to third electrode 7 side of FIG. 4) and light which is emitted from each emission region, reflected on the first electrode 2, and then travels in the light extraction direction. An interference with the reflected light which occurs on a light extraction surface side is also important and thus described in Embodiment 2.

In particular, in Embodiment 2, the third electrode 7 is a metal translucent film made of Ag, and hence the interference effect is changed between the two sub-pixels according to an optical distance between an emission region of the third organic EL layer and a reflection surface of the third electrode 7.

The first organic EL layer 3 and the second organic EL layer 4 have the different luminescent colors, and hence the first organic EL layer 3 and the second organic EL layer 4 are different in thickness from each other in view of optical interference effects. The two organic EL layers are different in thickness from each other, and hence the optical distances L5 and L6 between the emission region of the third organic EL layer and the reflection surface located on the light extraction side are changed between the sub-pixels as illustrated in FIG. 4.

Therefore, the optical interference effect with respect to the third organic EL layer 6 is changed between a stacked position of the first organic EL layer 3 and a stacked position of the second organic EL layer 4. As a result, a problem occurs that the emission chromaticity of the third organic EL layer 6 is changed between the sub-pixels.

In order to solve the above-mentioned problem, according to this embodiment, a PL peak wavelength of light from the third organic EL layer 6 is set to a value larger than a PL peak wavelength of light from at least one of the first organic EL layer 3 and the second organic EL layer 4.

The reason why the structure as described above is employed is as follows.

The optical distances in the first sub-pixel and the second sub-pixel are different from each other, and hence the interference effects in the respective sub-pixels are different from each other. Assume that, when the luminescent color of the third organic EL layer 6 is blue and when the luminescent color thereof is red, each of spectrums of lights which are emitted from the organic EL display apparatus and have the respective luminescent colors is shifted to a long-wavelength side by 10 nm.

In such a case, with respect to changes in peak wavelengths of the spectrums of the respective luminescent colors, the peak wavelength of the emission spectrum of blue is changed from 450 nm to 460 nm and the peak wavelength of the emission spectrum of red is changed from 620 nm to 630 nm. This exhibits that a change rate of the peak wavelength of the emission spectrum of red is relatively smaller than a change rate of the peak wavelength of the emission spectrum of blue.

Therefore, when the change rate of the peak wavelength of each of the emission spectrums is small, the influence of the change in chromaticity due to the optical distance difference is small.

Thus, as described above, the PL peak wavelength of the light from the third organic EL layer 6 is set to the value larger than the PL peak wavelength of the light from at least one of the first organic EL layer 3 and the second organic EL layer 4.

Table 4 illustrates the light emission chromaticities of the organic EL layers of the respective colors in Embodiment 2.

The third organic EL layer 6 is formed in common to the two sub-pixels and the emission chromaticity is changed between the two sub-pixels for the reason described above.

In Embodiment 2, from Table 4, the emission chromaticity difference between the sub-pixels in the third organic EL layer 6 is 0.007 which is expressed as a geometrical distance Δxy on CIExy. A geometrical distance on u'v' chromaticity which is set so as to be substantially proportional to a color sense difference actually sensed by a person is 0.050.

TABLE 4

| Second organic EL layer (G) | | First organic EL layer (B) | |
|---|---|---|---|
| CIEx | CIEy | CIEx | CIEy |
| 0.291 | 0.665 | 0.144 | 0.114 |
| Third organic EL layer (R) | | | |
| CIEx | CIEy | CIEx | CIEy |
| 0.68 | 0.32 | 0.675 | 0.325 |
| Chromaticity difference between sub-pixels | | | |
| Δxy | | 0.007 | |
| Δu'v' | | 0.050 | |

As described above, according to Embodiment 2, the chromaticity difference between the sub-pixels in the emission layer of the organic EL layer formed in common to the two sub-pixels is small, and hence a high-quality image may be displayed on the organic EL display apparatus manufactured by the simple process.

The driving method may be the same as in Embodiment 1 or a publicly-known driving method may be used, and thus the description thereof is omitted.

The intermediate electrode (second electrode 5 in FIG. 2) which separates the first organic EL layer 3 and the second organic EL layer 4 from the third organic EL layer 6 may be used in common to the three organic EL layers or separated into three electrodes.

In Embodiments 1 and 2, the top emission type is described. The present invention is effective even in a bottom emission type. In the case of the bottom emission type, the light extraction side is a substrate 1 side.

Comparative Embodiment 2

Comparative Embodiment 2 shows a case where an organic EL layer including an emission layer of blue (expressed by B in table, which is abbreviation for blue) is formed in common to the two sub-pixels under an organic EL layer including an emission layer of green (expressed by G in table, which is abbreviation for green) and an organic EL layer including an emission layer of red (expressed by R in table, which is abbreviation for red) through an electrode.

In Comparative Embodiment 2, the organic EL layer of red and the organic EL layer of blue in Embodiment 2 are interchanged.

Table 5 illustrates light emission chromaticities of the organic EL layers of the respective colors in Comparative Embodiment 2. The emission chromaticity of the organic EL layer of blue which is formed in common to the two sub-pixels is changed between the sub-pixels. Specifically, the emission chromaticity difference between the sub-pixels is 0.017 as Δxy and 0.168 as Δu'v'.

Therefore, as is apparent from Tables 4 and 5, the structure in which the organic EL layer including the emission layer of red with the longest wavelength is formed in common to the two sub-pixels has the small chromaticity difference between the sub-pixels, as in Embodiment 2.

TABLE 5

| Second organic EL layer (G) | | First organic EL layer (R) | |
|---|---|---|---|
| CIEx | CIEy | CIEx | CIEy |
| 0.272 | 0.666 | 0.669 | 0.331 |
| Third organic EL layer (B) | | | |
| CIEx | CIEy | CIEx | CIEy |
| 0.128 | 0.103 | 0.132 | 0.12 |
| Chromaticity difference between sub-pixels | | | |
| Δxy | | 0.017 | |
| Δu'v' | | 0.168 | |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-181507 filed on Jul. 11, 2008, and No. 2009-162847 filed on Jul. 9, 2009 which are hereby incorporated by reference herein in its entirety.

The invention claimed is:

1. An organic electroluminescence display apparatus comprising:
a substrate;
a first organic layer formed on a first sub-pixel;
a second organic layer formed on a second sub-pixel;
a third organic layer having a same thickness continuously formed on the first sub-pixel and the second sub-pixel, the first organic layer and the second organic layer being arranged side by side; and
an intermediate electrode, the first organic layer and the third organic layer being stacked via the intermediate electrode and the second organic layer and the third organic layer being stacked via the intermediate electrode;
wherein a distance between the intermediate electrode and an electrode sandwiching the first organic layer and a distance between the intermediate electrode and an electrode sandwiching the second organic layer are different, and
wherein the third organic layer has an emission spectrum peak wavelength which is longer than an emission spectrum peak wavelength of at least one of the first organic layer and the second organic layer.

2. The organic electroluminescence display apparatus according to claim 1, wherein the third organic layer has a luminescent color of red.

3. The organic electroluminescence display apparatus according to claim 1, wherein the third organic layer has a luminescent color of green.

4. The organic electroluminescence display apparatus according to claim 1, wherein the intermediate electrode comprises a metal film.

5. The organic electroluminescence display apparatus according to claim 4, wherein a thickness of the intermediate electrode is 10 nm to 20 nm.

6. The organic electroluminescence display apparatus according to claim 1, wherein the substrate, the first organic layer, the intermediate electrode, and the third organic layer are stacked in order.

7. The organic electroluminescence display apparatus according to claim 1, wherein the substrate, the third organic layer, the intermediate electrode, and the first organic layer are stacked in order.

8. An organic electroluminescence display apparatus comprising:
a substrate;
a first organic electroluminescence element comprising electrodes and a first organic layer which includes at least an emission layer and which is sandwiched by the electrodes;
a second organic electroluminescence element comprising electrodes and a second organic layer which includes at least an emission layer and which is sandwiched by the electrodes; and
a third organic electroluminescence element comprising electrodes and a third organic layer which includes at least an emission layer and which is sandwiched by the electrodes,
wherein the first organic electroluminescence element and the second organic electroluminescence element are arranged side by side in an emission region corresponding to a pixel,
wherein a distance between the electrodes of the first organic electroluminescence element and a distance between the electrodes of the second organic electroluminescence element are different,
wherein the third organic layer has a same thickness continuously formed on the first organic layer and the second organic layer through an intermediate electrode which is one of the electrodes of the first electroluminescence element, one of the electrodes of the second electroluminescence element and one of the electrodes of the third electroluminescence element, and
wherein the third organic layer has an emission spectrum peak wavelength which is longer than an emission spectrum peak wavelength of at least one of the first organic layer and the second organic layer.

9. The organic electroluminescence display apparatus according to claim 8, wherein the intermediate electrode comprises a metal thin film.

10. The organic electroluminescence display apparatus according to claim 9, wherein a thickness of the intermediate electrode is 10 nm to 20 nm.

11. The organic electroluminescence display apparatus according to claim 8, wherein the third organic layer has a luminescent color of red.

12. The organic electroluminescence display apparatus according claim 8, wherein the third organic layer has a luminescent color of green.

13. The organic electroluminescence display apparatus according to claim 8, wherein the first organic electroluminescence element satisfies the following formula (1):

$$2L1/\lambda 1 + \delta/2\pi = m \quad (1)$$

where L1 indicates an optical distance between an emission region of an emission layer in the first organic layer and a reflection surface of the electrode which is disposed between the first organic layer and the substrate, $\lambda 1$ indicates an emission spectrum peak wavelength of the emission layer in the first organic layer, $\delta$ indicates a phase shift amount on the electrode which is disposed between the first organic layer and the substrate, and m indicates a natural number; and
wherein the second organic electroluminescence element satisfies the following formula (2):

$$2L2/\lambda 2 + \delta/2\pi = m \quad (2)$$

where L2 indicates an optical distance between an emission region of an emission layer in the second organic layer and a reflection surface of the electrode which is disposed between the second organic layer and the substrate, $\lambda 2$ indicates an emission spectrum peak wavelength of the emission layer in the second organic layer, $\delta$ indicates a phase shift amount on the electrode which is disposed between the second organic layer and the substrate, and m indicates a natural number.

14. The organic electroluminescence display apparatus according to claim 8, wherein the substrate, the first organic layer, the intermediate electrode, and the third organic layer are stacked in order.

15. The organic electroluminescence display apparatus according to claim 8, wherein the substrate, the third organic layer, the intermediate electrode, and the first organic layer are stacked in order.

* * * * *